United States Patent [19]

Hemmer et al.

[11] Patent Number: 5,077,747
[45] Date of Patent: Dec. 31, 1991

[54] ALIGNMENT-INSENSITIVE METHOD FOR WIDEBAND TUNING OF AN UNMODIFIED SEMICONDUCTOR LASER

[75] Inventors: Philip R. Hemmer, Fitchburg, Mass.; Bruce E. Bernacki, Tucson, Ariz.

[73] Assignee: The United States of America as represented by the Secretary of the Air Force, Washington, D.C.

[21] Appl. No.: 400,618

[22] Filed: Aug. 30, 1989

[51] Int. Cl.$^5$ .............................................. H01S 3/10
[52] U.S. Cl. ..................................................... 372/20
[58] Field of Search .................................. 372/20, 92

[56] References Cited

PUBLICATIONS

B. E. Bernacki et al., "Alignment-Insensitive Technique for Wideband Tuning of an Unmodified Semiconductor Laser", *Optics Letters*, vol. 13, No. 9, Sep. 1988, pp. 725–727.
C. L. Tang et al., "Wide-Band Electro-Optical Tuning of Semiconductor Lasers", *Applied Physics Letters*, vol. 30, No. 2, Jan. 15, 1977, pp. 113–116.
N. Lee et al., "Single Longitudinal Mode TEA $CO_2$ Laser With Tilted in Tracavity Etalon", *Applied Optics*, vol. 16, No. 10, Oct. 1977, pp. 2620–2621.

*Primary Examiner*—James W. Davie
*Attorney, Agent, or Firm*—Robert L. Nathans; Donald J. Singer

[57] ABSTRACT

Using simple optical components and an unmodified commercial off-the-shelf semiconductor laser, a frequency-selective self-aligning optical-feedback technique has been devised that allows a semiconductor laser to be tuned to and scanned about any optical frequency within the laser gain curve. This technique employs a graded-index rod lens cat's eye and an intracavity etalon for selecting one laser side mode. By changing the external cavity length, the laser frequency can be continuously tuned within one external cavity free spectral range. To further extend the tuning range, the laser injection current is changed to produce a discontinuous hop in the laser frequency. To eliminate the hops the cavity length and laser current are changed simultaneously.

29 Claims, 2 Drawing Sheets 500,777,747

ALIGNMENT-INSENSITIVE METHOD FOR WIDEBAND TUNING OF AN UNMODIFIED SEMICONDUCTOR LASER

STATEMENT OF GOVERNMENT INTEREST

The invention described herein may be manufactured and used by or for the Government for governmental purpose without the payment of any royalty thereon.

BACKGROUND OF THE INVENTION

Many applications, such as laser spectroscopy, optical pumping, and isotope separation, require a tunable narrow-linewidth source in the near infrared. Semiconductor lasers are an attractive alternative for these applications because of their relatively low cost, small size, and simplicity of operation. However, semiconductor lasers have had limited spectroscopic applications because of their inability to be tuned to arbitrary frequencies of interest within the laser gain curve. To alleviate this problem, several optical-feedback schemes have been devised that employ frequency-selective elements, such as gratings or etalons, in the feedback path. The most successful of these is discussed by Favre et al., who demonstrated continuous tuning of 15 nm with a linewidth of 20 kHz (deduced from beat spectrum). See F. Favre, D. LeGuen, J. C. Simon and B. Landousies, Electron. Lett. 22, 795 (1986). Others have also demonstrated the ability to tune (discontinuously) to arbitrary frequencies within the laser gain curve with linewidths of 100 kHz or less. Linewidth reduction without improved tuning characteristics has also been achieved by using nonfrequency-selective feedback. However, all the optical-feedback techniques that demonstrate the ability to tune to arbitrary laser frequencies require the use of modified anti-reflection coated lasers which are difficult to make and are thus very costly to purchase, and, in addition, are highly sensitive to alignment of the external optics. These factors detract from the simplicity and low cost inherent in semiconductor lasers.

SUMMARY OF A PREFERRED EMBODIMENT OF THE INVENTION

A simple optical-feedback technique is described that permits an ordinary off-the-shelf semiconductor diode laser to be tuned to arbitrary frequencies within the laser gain curve. In addition, this method is not highly sensitive to optical misalignments. More specifically, a one-piece cat's-eye retro-reflector serves as a feedback mirror, and a tilted intracavity solid etalon, functioning as a laser mode selection filter, provides frequency selectivity. The use of a one-piece retro-reflector contributes greatly to the simplicity of the technique because it eliminates the need for fine angular adjustment of the feedback mirror. The etalon, having approximately one fifth the optical thickness of the semiconductor laser, forces the laser to lase in the longitudinal mode of interest. Long range continuous frequency tuning is provided by changing the external cavity length and concurrently the laser injection current and in some cases the etalon tilt angle, thereby eliminating tuning discontinuities.

BRIEF DESCRIPTION OF THE DRAWINGS

Other objects, features, and advantages of the present invention will become apparent upon study of the following description taken in conjunction with the drawings in which.

Figure 1:
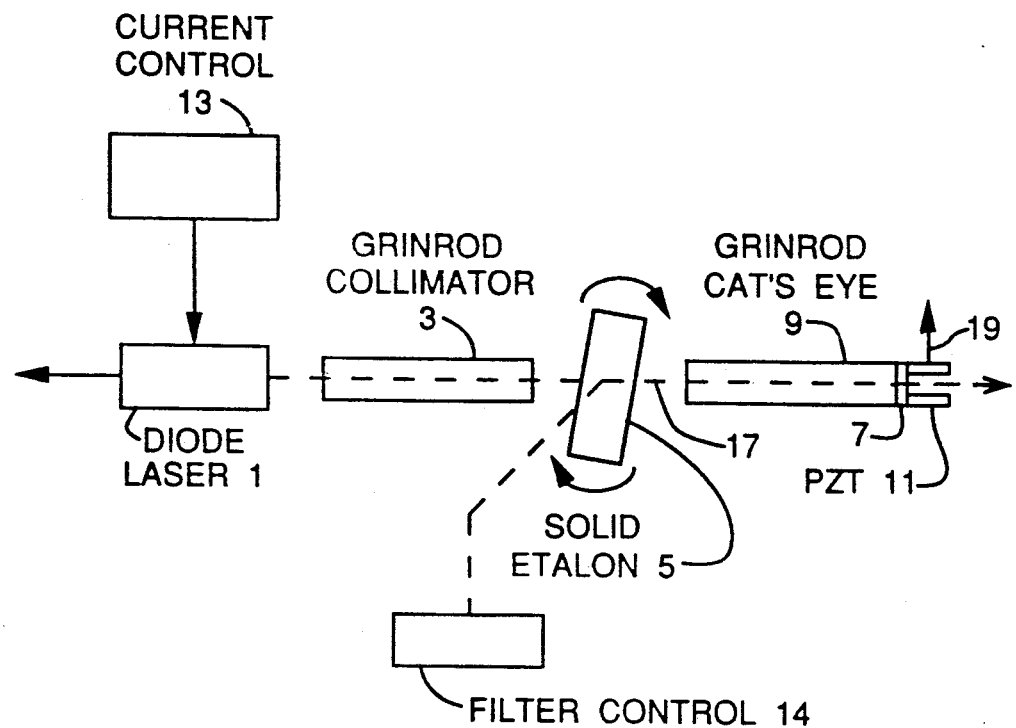
FIG. 1 illustrates a preferred embodiment of the invention.

The basic laser feedback setup is shown in FIG. 1. The output of an off-the-shelf semiconductor laser 1 is first collimated by a 0.22-pitch antireflection-coated plano-convex graded-index rod (GRINROD) lens 3 and then filtered by a mode selection filter most preferably a tilted solid etalon 5 (optical thickness 0.15 mm, 80% reflectivity). Next, this light is reflected back into the laser by the uncoated rear surface 7 of a 0.25-pitch GRINROD lens 9 mounted on a piezoelectric transducer (PZT) cylinder 11. The front surface of the GRINROD cat's eye in our setup is antireflection coated. However, this is not essential, since the front surface relection is highly alignment sensitive and can easily be deflected away from the laser. Moreover, the rear surface may also be coated with a reflective coating to increase the intensity of feedback light for some applications. This GRINROD lens 9 serves as a one-piece cat's eye (i.e., retro-reflector). Because of the self-aligning nature of the cat's-eye reflector, the external cavity consistently maintains its alignment so that there is no need to provide any adjustments for fine angular alignment. Theoretically, a cat's-eye retro-reflector merely trades angular sensitivity for transverse positional sensitivity. However, experimentally, for a 1-mm diameter semiconductor laser beam and a 2-mm diameter GRINROD cats eye 9, it is found that the feedback light level remains relatively constant when the transmitted portion of the laser beam merely passes unobstructed through the GRINROD lens 9.

The etalon passband may be tuned by adjusting its tilt angle mechanically by a filter control rotary transducer 14, or manually. Typical feedback light levels used by us were of the order of 0.25%, and the total cavity length was about 10 cm. Feedback light level was controlled by using either a variable attenuator or a rotating polarizer, or by simply translating the 2-mm GRINROD cat's eye 9 in a direction perpendicular to axis 17 as indicated by arrow 19 of FIG. 1, so as partially to eclipse the feedback light. This advantageously eliminates the cost of the attenuator or polarizer. For a 1-mm optical path length semiconductor laser cavity having 30% facet reflectivity, this results in a theoretical linewidth reduction factor of 55 using the expressions of Goldberg et al. See L. Goldberg, H. F. Taylor, A. Dandridge, J. F. Weller and R. 0. Miles, IEEE J. Quantum Electron QE-18, 555 (1982). Of course, much greater linewidth reduction could be achieved with a longer external cavity. The light output of the device of FIG. 1 may be retrieved by positioning a beamsplitter upon optical axis 17, or may be directly retrieved from the laser at 15.

Figure 2:
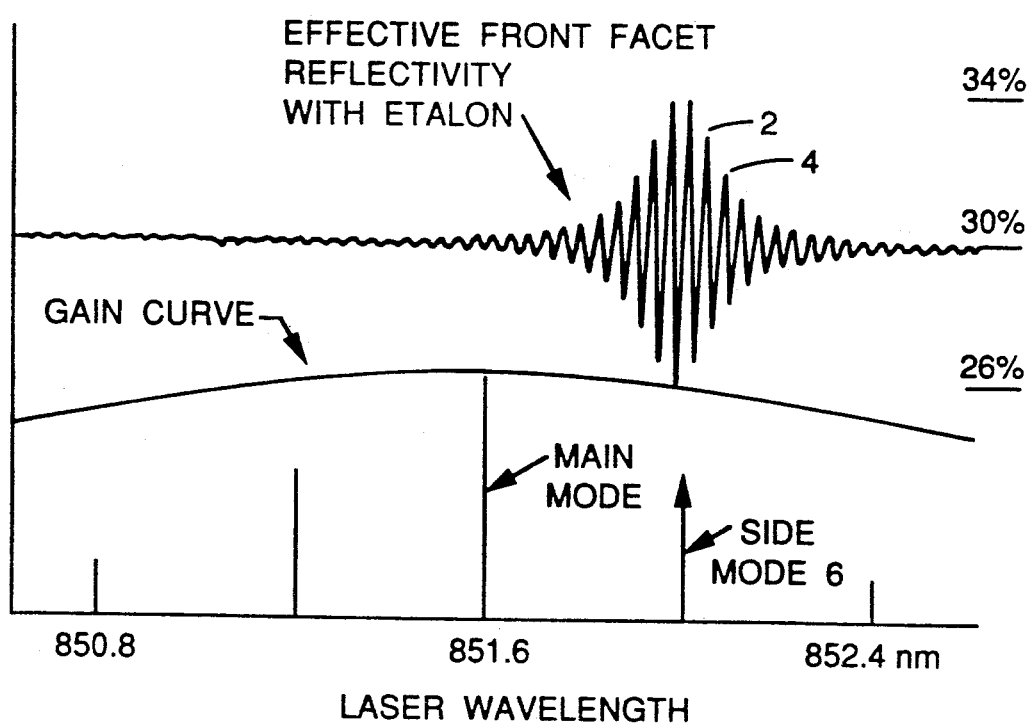
FIG. 2 illustrates mode selection.

The theory of single-mirror, low-level optical feedback is well known but is reviewed here briefly. A semiconductor laser with a simple external-feedback mirror can be viewed as having an effective facet reflectivity that varies sinusoidally with wavelength, where the period of the sine wave is determined by the free spectral range of the external cavity. With an intracavity etalon, this sinusoidally varying facet reflectivity is modulated by an envelope function that is derived from the etalon transmission, as illustrated in the upper portion of FIG. 2. For clarity, this figure corresponds to a 1-cm external cavity length, and the slope of the gain curve is exaggerated. If the etalon passband transmission is centered on any one of the possible laser side modes, indicated at the lower portion of FIG. 2, the laser is forced to oscillate only in that mode. Thus by adjusting the passband of the etalon, the semiconductor laser can be forced to lase in a longitudinal mode that is different from the main mode. In fact, we have found that by appropriately choosing the finesse and free spectral range of the etalon, we were able to achieve lasing in any of five or six different longitudinal modes.

We now demonstrate the applicability of our technique to the excitation of a cesium resonance by employing a nominally 852-nm Ortel SL 300 laser. FIG. 3a shows a series of traces obtained by ramping the laser current, i from the threshold to the highest-rated current (40 mA) while monitoring the laser intensity after it passes through a cesium vapor cell. FIG. 3(a) shows data obtained without optical feedback for a variety of different laser temperatures. As can be seen, the laser excites cesium efficiently only for one combination of temperature and current, i.e., the top trace. This is typical for several Ortel SL 300 lasers that we have tested as well as for lasers from other manufacturers, and is a consequence of the well-known discontinuous tuning characteristics of semiconductor lasers. See G. P. Agrawal and N. K. Dutta, Long Wavelength Semiconductors Lasers (Van Nostrand Reinhold, N.Y., 1986). In fact, for some nominally 852-nm lasers, it is not possible to excite the cesium resonance for any combination of current and temperature.

Figure 3:
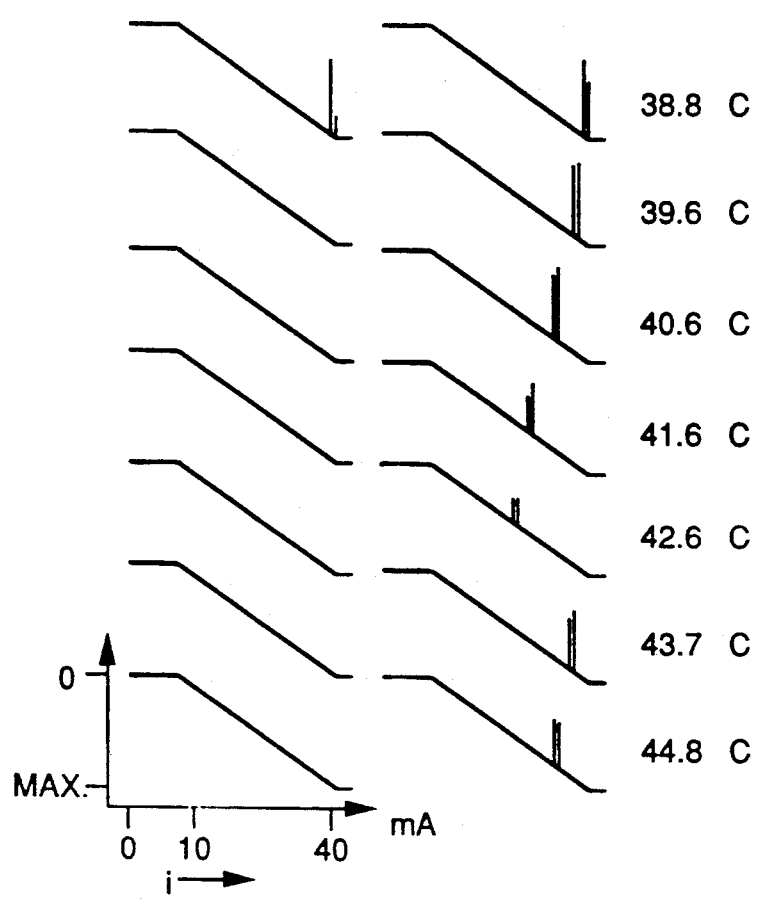
FIG. 3(a) and 3(b) illustrate absorption v. laser current (for non-continuous frequency scan)

With our apparatus of FIG. 1, however, it is possible to force the laser to excite cesium at a variety of temperatures as shown in FIG. 3(b). The cesium absorption was obtained by simply tilting the etalon at each temperature until a strong cesium absorption was found. It should be emphasized that the data in FIG. 3 do not correspond to a continuous laser frequency scan but merely demonstrate the ability to excite cesium over a broad temperature or injection-current range. These data illustrate that reliable tuning to an atomic resonance such as cesium is possible even though the laser may not excite the resonance without feedback. This is particularly important for practical applications, since even lasers that excite an atomic resonance initially often fail to do so afterward as a consequence of aging. See M. Ohtsu, M. Hashimoto, and H. Ozawa, in Proceedings of the 39th Annual Frequency Symposium (Institute of Electrical and Electronics Engineers, New York, 1985), p. 43. The data in FIG. 3(b) also suggest that it is even possible to use a prechosen injection-current level (optical power output) and still be able to excite the cesium resonances. This is clearly a useful feature for design considerations.

Figure 4:
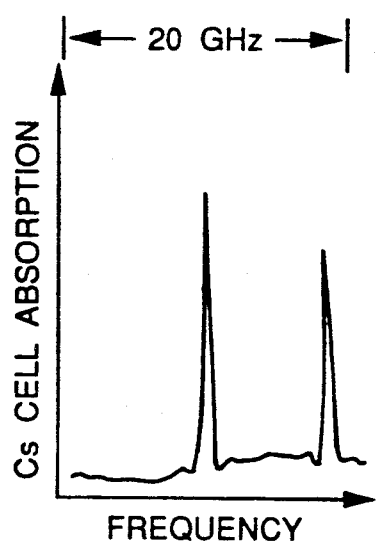
FIG. 4 illustrates cell absorption as a function of frequency.

Once the laser cavity mode has been selected, it is desirable in many applications to tune the laser continuously about the chosen frequency. This can be done by changing the length of the external cavity, e.g., by translating retro-reflector lens 9 along optical axis 17 by actuating PZT 11 coupled thereto. However, to achieve long-range continuous-frequency scans (greater than the external-cavity free spectral range) it is necessary to vary the external-cavity length, and the laser injection current concurrently by use of laser current control 13 to change the laser injection current. The external-cavity length can be defined as the distance between semiconductor laser 2 and the right hand portion 7 of cat's eye lens 9. Hence a change of the external cavity length also changes the length of the optical axis which terminates at portion 7. Thus, by changing the external cavity length, the laser frequency can be continuously tuned within one external cavity free spectral range. To further extend the tuning range, the laser injection current is changed to produce a discontinuous hop in the laser frequency, e.g. initially from point 2 to point 4 of FIG. 2. To eliminate the hops, the cavity length and laser current is changed simultaneously. Concurrent scanning ca be done either open loop or with a servo. We constructed a servo for this purpose by modulating the laser current and demodulating the laser output power to produce an error signal. However, the laser current modulation produced approximately 100 MHz of laser frequency modulation, which is unacceptable for some applications. FIG. 4 shows a typical open-loop scan of the cesium $D_2$ hyperfine components as a function of laser frequency. Note that this scan exceeds the 9.2-GHz separation of these lines. The additional structure visible in the data of FIG. 4 results from adjacent side modes of the external cavity, 1.5 GHz to either side of the main mode. These side modes typically arise for feedback light levels slightly greater than optimum and can of course be made smaller, at the expense of linewidth, by attenuating the optical-feedback light. In fact, the total scan range in this trace is about 20 GHz and is at present limited by PZT travel. However, this is not a fundamental limitation since a self-aligning retroreflector can be translated by a variety of elecromagnetic devices that would not provide sufficient alignment stability for a non-self-aligning reflector. The important feature of these data is that they were obtained at temperature and injection-current levels for which the laser was unable to excite cesium without feedback.

Although the cesium resonances in a vapor cell have linewidths of the order of 1 GHz, many applications require that the laser have a much narrower linewidth. Measurements made with a 300-MHz free-spectral-range 2-MHz instrumental linewidth optical spectrum analyzer showed that the laser spectral linewidth remained less than 3 MHz over the entire 20-GHz scan of FIG. 4. In addition, there was approximately 15 MHz of laser frequency jitter present, owing to acoustically induced fluctuations in the external-cavity length. This is consistent with the expected factor-of-55 linewidth reduction, mentioned earlier, for an Ortel SL 300 laser having a free-running linewidth of 125 MHz. Of course, the linewidth can be narrowed much further, if required, by using a longer external cavity, but at the expense of the continuous tuning range.

Finally, although the aforesaid data were obtained by us using Ortel SL 300 lasers, similar results were also obtained using Mitsubishi ML 2701 lasers.

In summary, we have demonstrated a novel, robust (phaseand alignment-insensitive) optical-feedback method that can be used to tune an unmodified off-the-shelf semiconductor laser to arbitrary frequencies within its gain curve. In addition, we also demonstrated repeatable continuous-frequency tuning of 20 GHz about the selected optical frequency, e.g., the cesium resonance.

While there has been described what is at present considered to be the preferred embodiments of this invention, it will be obvious to those skilled in the art that various changes and modifications may be made therein without departing from the invention and it is, therefore, intended in the appended claims to cover all such changes and modifications as fall within the true spirit and scope of the invention, including art recognized equivalents. For example, less preferred retro-reflectors could be employed such as corner cubes. The collimating means need not be separate from the laser and could be any agency of any nature associated with or within the laser causing it to produce collimated light. While light transmissive mode selection filters are preferred, reflective filters for reflecting the collimated light along an optical axis portions oblique with respect to axis portion 17, and at the retro-reflector positioned along the oblique axis portion, could be employed. Also, the length of the optical axis could be changed by moving the laser along the axis and maintaining the retro-reflector stationary.

What is claimed is:

1. Method of tuning a semiconductor laser not requiring an anti-reflection coating to one of a plurality of side modes within its gain curve comprising the steps of:
    (a) injecting a current into said semiconductor laser for causing said laser to emit light;
    (b) collimating the light produced within said semiconductor laser;
    (c) passing collimated light produced in accordance with step (b) along an optical axis and through a mode selection wavelength filter; and
    (d) employing a retro-reflector to retro-reflect the light passed through said mode selection filter back through said mode selection filter and into said semiconductor laser, said retro-reflector configured to reflect said light in the same direction as incident light directed thereat, regardless of variations in the orientation of said retro-reflector.

2. The method of claim 1 further including selecting a particular one of said side modes by adjusting the angular tilt position of said mode selection filter which comprises an etalon, relative to said optical axis.

3. The method of claim 1 further including the step of changing the length of said optical axis along with changing said current injected into said semiconductor laser to provide long range continuous frequency scans greater than the external cavity free spectral range.

4. The method of claim 2 further including the step of changing the length of said optical axis along with changing said current injected into said semiconductor laser to provide long range continuous frequency scans greater than the external cavity free spectral range.

5. Apparatus for tuning a semiconductor laser not requiring an anti-reflection coating to one of a plurality of side modes within its gain curve comprising:
    (a) means for collimating light produced within said semiconductor laser and for directing said light along an optical axis and through a mode selection wavelength filter; and
    (b) self-aligning-retro-reflector means for retro-reflecting the light passed through said mode selection filter back through said mode selection filter and thereafter into said semiconductor laser forcing said semiconductor laser to laser at a chosen frequency, said retro-reflector configured to reflect said light in the same direction as incident light directed thereat, regardless of variations in the orientation of said retro-reflector.

6. The apparatus of claim 5 further including filter control means for adjusting the passband of said mode selection filter.

7. The apparatus of claim 5 further including cavity length adjustment means, which need not maintain angular alignment of the retro-reflector means, for changing the length of said optical axis; and
    means for additionally changing current injected into said semiconductor laser, thereby to provide long range frequency scans greater than the external cavity free spectral range 8. The apparatus of claim 6 wherein said mode selection filter comprises a solid light transmissive etalon, and said means for adjusting the passband thereof includes means for adjusting the tilt angle of said etalon relative to said optical axis.

9. The apparatus of claim 7 wherein said mode selection filter comprises a solid etalon, and said means for adjusting the passband thereof includes means for adjusting the tilt angle of said etalon relative to said optical axis.

10. The apparatus of claim 5 wherein said retro-reflector means comprises a one piece cat's eye lens.

11. The apparatus of claim 6 wherein said retro-reflector means comprises a one piece cat's eye lens.

12. The apparatus of claim 7 wherein said retro-reflector means comprises a one piece cat's eye lens.

13. The apparatus of claim 8 wherein said retro-reflector means comprises a one piece cat's eye lens.

14. The apparatus of claim 9 wherein said retro-reflector means comprises a one piece cat's eye lens.

15. The apparatus of claim 5 further including means for translating said retro-reflector means in a direction perpendicular to said optical axis.

16. The apparatus of claim 7 further including means for translating said retro-reflector means in a direction perpendicular to said optical axis.

17. The apparatus of claim 8 further including means for translating said retro-reflector means in a direction perpendicular to said optical axis.

18. The apparatus of claim 10 further including means for translating said retro-reflector means in a direction perpendicular to said optical axis.

19. The apparatus of claim 11 further including means for translating said retro-reflector means in a direction perpendicular to said optical axis.

20. The apparatus of claim 12 further including means for translating said retro-reflector means in a direction perpendicular to said optical axis.

21. The apparatus of claim 10 wherein said one piece cat's eye lens comprises a graded index rod to preserve polarization of light transmitted therethrough.

22. The apparatus of claim 12 wherein said one piece cat's eye lens comprises a graded index rod to preserve polarization of light transmitted therethrough.

23. The apparatus of claim 13 wherein said one piece cat's eye lens comprises a graded index rod to preserve polarization of light transmitted therethrough.

24. Method of tuning a semiconductor laser to one of a plurality of side modes within its gain curve comprising the steps of:
    (a) causing said laser to emit light;
    (b) collimating the light produced within said semiconductor laser;
    (c) passing collimated light produced in accordance with step (b) along an optical axis and through a mode selection wavelength filter; and (d) employing a retro-reflector to retro-reflect the light passed through said mode selection filter back through said mode selection filter and into said semiconductor laser, said retro-reflector configured to reflect said light in the same direction as incident light directed thereat, regardless of variations in the orientation of said retro-reflector.

25. The method of claim 24 further including selecting a particular one of said side modes by adjusting the angular tilt position of said mode selection filter which comprises an etalon, relative to said optical axis.

26. The method of claim 24 further including the step of changing the length of said optical axis to provide frequency scans within the external cavity free spectral range.

27. The method of claim 25 further including the step of changing the length of said optical axis within the external cavity free spectral range.

28. The method of claim 26 further including the step of concurrently changing current injected into said semiconductor laser to provide long range continuous frequency scans greater than the external cavity free spectral range.

29. The method of claim 27 further including the step concurrently changing current injected into said semiconductor laser to provide long range continuous frequency scans greater than the external cavity free spectral range.

* * * * *